United States Patent [19]
Comminges et al.

[11] Patent Number: 5,815,103
[45] Date of Patent: Sep. 29, 1998

[54] ACCURATE DIGITAL-TO-ANALOG CONVERTER

[75] Inventors: Martial Comminges, Grenoble; Francis Dell'Ova, Saint Hilaire Du Touvet; Frédéric Paillardet, Grenoble, all of France

[73] Assignee: SGS-Thomson Microelectronics S.A., Saint Genis, France

[21] Appl. No.: 634,306

[22] Filed: Apr. 16, 1996

[30] Foreign Application Priority Data

Apr. 28, 1995 [FR] France .................................. 95 05367

[51] Int. Cl.⁶ ...................................................... H03H 1/66
[52] U.S. Cl. ........................................... 341/144; 341/136
[58] Field of Search .................................. 341/143, 144, 341/127, 138, 135, 136, 153

[56] References Cited

U.S. PATENT DOCUMENTS

| | | | |
|---|---|---|---|
| 3,924,229 | 12/1975 | Liu | 340/347 |
| 4,605,907 | 8/1986 | Rosenthal et al. | 330/257 |
| 4,616,189 | 10/1986 | Pengue, Jr. | 330/253 |
| 4,667,165 | 5/1987 | De Weck | 330/253 |
| 4,683,458 | 7/1987 | Hallgren | 340/347 |
| 4,904,953 | 2/1990 | McCormack | 330/258 |
| 5,491,448 | 2/1996 | Naokawa et al. | 330/264 |
| 5,493,205 | 2/1996 | Gorecki | 323/315 |
| 5,614,860 | 3/1997 | Osaki et al. | 327/552 |

OTHER PUBLICATIONS

French Search Report from French Patent Application No. 95 05367, filed Apr. 28, 1995.

IEEE Journal of Solid–State Circuits, vol. 26, No. 12, Dec. 1991, pp. 1775–1780, H.J. Schouwenaars' et al. "An Over-sampled Multibit CMOS D/A Converter For Digital Audio with 115–dB Dynamic Range".

*Primary Examiner*—Howard L. Williams
*Assistant Examiner*—Peguy JeanPierre
*Attorney, Agent, or Firm*—Wolf, Greenfield & Sacks, P.C.

[57] ABSTRACT

A digital-to-analog converter that includes pairs of positive and negative current sources that are connected through switches to two differential output lines. The switches are controlled as a function of a digital data. Each pair of current sources includes a pair of transistors of an output stage of a transconductance amplifier. The transconductance amplifier receives a reference voltage at a non-inverting input, and receives at an inverting input, the voltage at the middle node of a bridge of resistors that is connected between the two differential out-put lines. The output of the converter is the voltage between the two differential output lines.

35 Claims, 2 Drawing Sheets

ACCURATE DIGITAL-TO-ANALOG CONVERTER

BACKGROUND OF THE INVENTION

1. Field of the Invention

The present invention relates to accurate digital-to-analog converters, such as those used for restoring sound recorded on compact disks.

2. Discussion of the Related Art

To achieve a digital-to-analog conversion having a moderate accuracy, a selected number of current sources among a set of current sources is conventionally connected to a common output line as a function of a digital data. Because of unavoidable mismatching of the current sources, the accuracy of this method cannot exceed 10 bits.

FIG. 1 is a schematic illustrating a digital-to-analog converter for obtaining higher accuracy, described in an article of IEEE Journal of Solid-State Circuits, vol. 26, No. 12, Dec. 1991, entitled "An Oversampled Multibit CMOS D/A Converter for Digital Audio with 115-dB Dynamic Range". This converter includes a set of positive current sources IP1 to IPn and negative current sources IN1 to INn. A digital control signal C selects the positive or negative current sources to be complementarily connected to two differential output lines Iout and Iout*. The differential mode operation improves some characteristics, such as noise sensitivity. The current sources IP and IN have the same value I, and are generally connected so that they are permanently connected to either one of lines Iout or Iout*, to avoid switching noise.

To obtain a high conversion accuracy, each source IP is periodically calibrated with a calibrating source IPc, and each source IN is periodically calibrated with a calibrating source INc. The value of a source IP or IN is maintained between two calibrations by capacitive effect. Thus, it is ensured that the value of each source IP is equal to the value of the calibration source IPc and that the value of each source IN is equal to the value of the calibration source INc.

To decrease distortion, lines Iout and Iout* should symmetrically vary one with respect to the other. This causes the value of sources IN to be equal to the value of sources IP, or the value of the calibration source IPc to be equal to the value of the calibration source INc. For this purpose, the sets of sources IP and IN each comprise an additional source IPs and INs, respectively, that are connected to each other. The difference in current between sources IPs and INs is drawn through an integrator 10 whose output readjusts the value of the calibration source INc until the currents of sources IPs and INs are equal.

However, the quality of this symmetry adjustment depends upon the matching of source IPs with each source IP and of source INs with each source IN. Because of the high number of sources, this matching is very difficult to achieve.

SUMMARY OF THE INVENTION

An object of the present invention is to provide an accurate digital-to-analog converter in which adjustment of the symmetry is particularly accurate.

To achieve this object, the present invention provides a digital-to-analog converter which includes pairs of positive and negative current sources that are connected through switches to two differential output lines, the switches are controlled as a function of a digital data. Each pair of current sources is a pair of transistors of an output stage of a transconductance amplifier. The transconductance amplifier receives a reference voltage on its non-inverting input and receives on its inverting input the voltage at the middle node of a resistor bridge that is connected between the two differential output lines. The output of the converter is the voltage between the two differential output lines.

According to an embodiment of the invention, the transconductance amplifier includes a differential stage. The current in a first branch of the differential stage is mirrored in first transistors of the pairs of transistors and the current of a second branch of the differential stage is mirrored in second transistors of the pairs of transistors.

According to an embodiment of the invention, the transistors of the pairs of transistors are connected to respective cascode transistors, biased with respect to the voltage at the middle node of the resistor bridge.

BRIEF DESCRIPTION OF THE DRAWINGS

The foregoing and other objects, features, aspects and advantages of the invention will become apparent from the following detailed description of the present invention when taken in conjunction with the accompanying drawings, in which.

DETAILED DESCRIPTION

Figure 2:
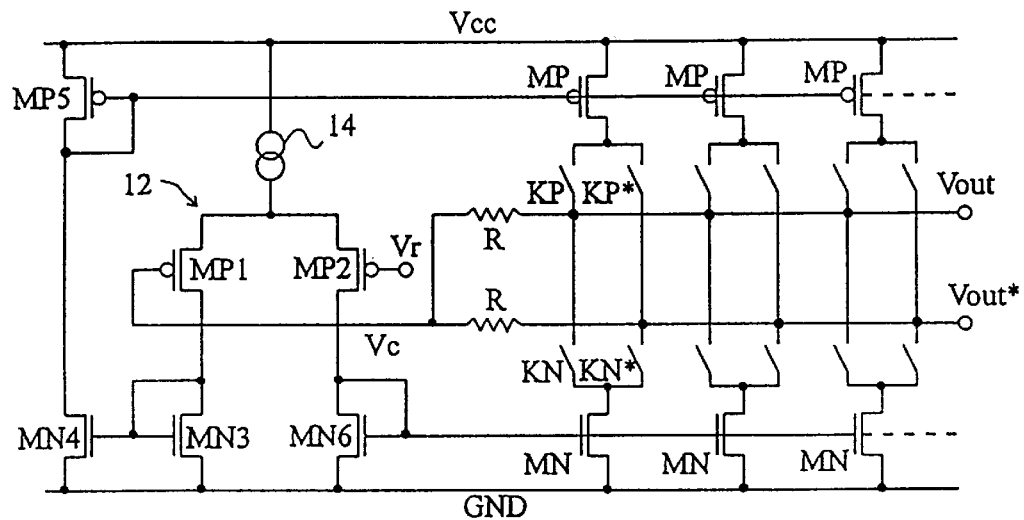
FIG. 2 is an embodiment of a digital-to-analog converter according to the present invention.

In FIG. 2, a set of positive current sources is formed by P-channel MOS transistors MP having their sources and gates connected in parallel, the sources being connected to a high supply voltage Vcc. A complementary set of negative current sources is formed by N-channel MOS transistors MN having their sources and gates connected in parallel, the sources being connected to a low supply voltage GND. The drain of each MP transistor is connected to two differential output lines Vout and Vout* through two respective switches KP and KP*. The drain of each transistor MN is connected to the lines Vout and Vout* through two respective switches KN and KN*. The switches KP, KN, KP*, and KN* can be conventionally controlled using digital data to establish a corresponding analog differential signal on lines Vout and Vout*.

According to the invention, transistors MP and MN form an output stage of a transconductance amplifier. The amplifier includes an input differential stage 12 formed, for example, by two P-channel MOS transistors MP1 and MP2 whose sources are connected to voltage Vcc through a quiescent current source 14. The drain current of transistor MP1, forming a first branch of the stage 12, is mirrored in each transistor MP through a first current mirror circuit. Similarly, the drain current of transistor MP2, forming a second branch of the stage 12, is mirrored in each transistor MN through a second current mirror circuit.

The first current mirror circuit includes an N-channel MOS transistor MN3 having its drain and gate connected to the drain of transistor MP1, and its source connected to voltage GND. An N-channel MOS transistor MN4 is connected in parallel to transistor MN3 through its gate and its source, and forms with transistor MN3 a current mirror which mirrors the current of transistor MP1 in transistor MN4. The drain of transistor MN4 is connected to the drain and the gate of a P-channel MOS transistor MP5 having its source connected to voltage Vcc. In addition, transistor MP5 is connected in parallel to transistors MP through its source and its gate. Thus, transistors MP5 and MP form a current mirror which mirrors in each transistor MP the drain current of transistor MN4, and accordingly that of transistor MP1.

The second current mirror circuit includes an N-channel MOS transistor MN6 having its drain and gate connected to the drain of transistor MP2. In addition, transistor MN6 has its gate and its source connected in parallel to transistors MN and forms, with transistors MN a current mirror which mirrors in each transistor MN the drain current of transistor MP2.

The gate of transistor MP1 forms an inverting input for the transconductance amplifier, and the gate of transistor MP2 forms a non-inverting input. The gate of transistor MP1 receives the voltage Vc present at the middle node of a bridge of resistors R of same value connected between the differential output lines Vout and Vout*.

The output of the converter according to the invention is the differential voltage present across the bridge of resistors R (or across lines Vout and Vout*). The gate of transistor MP2 receives a reference voltage Vr, which is the voltage to which the converter output should be symmetrical.

With this configuration, a structure similar to that of a unitary gain amplifier is formed, the middle node Vc of the bridge of resistors R being the amplifier output. Thus, voltage Vc is regulated on the reference voltage Vr, which ensures voltage symmetry between lines Vout and Vout* with respect to voltage Vr, independently of the number of sources MP or MN connected to lines Vout and Vout*, provided that at least one source MP is connected to one of the lines Vout and Vout* and at least one source MN is connected to the other line.

If, for example, voltage Vc increases, the current in transistor MP1 decreases. As a result, through the current mirror circuit MN3, MN4 and MP5, the conductance of transistors MP decreases, which causes voltage Vc to decrease. Simultaneously, the current of transistor MP2 increases symmetrically with the decrease in current of transistor MP1. As a result, through transistor MN6, the conductance of transistors MN increases, which also tends to decrease voltage Vc. Thus, this circuit effectively tends to reestablish the equilibrium point where voltage Vc is equal to the reference voltage Vr. The symmetry of the output signal, i.e., of the differential voltage across lines Vout and Vout*, depends only upon the ratio between resistors R. The matching of only two resistors can be particularly accurate, since resistors R can be integrated with a high packing density.

Figure 1:
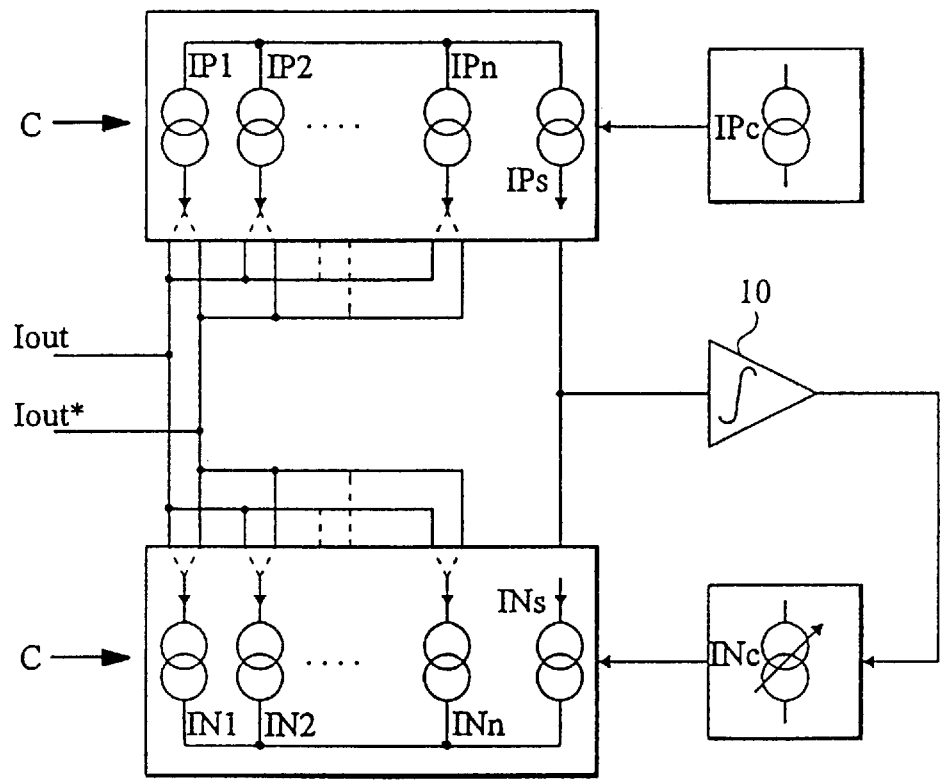
FIG. 1 is a schematic of a digital-to-analog converter of conventional accuracy.

A converter according to the invention is particularly adapted for a specific method of switching transistors MP and MN for obtaining the desired accuracy. This so-called butterfly switching method is very simple to implement and is as accurate as the periodically self-sampling method described with relation to FIG. 1. Assuming that m transistors MP must be connected to line Vout (and therefore m transistors MN to line Vout*), the method according to the invention consists of selecting, at each switching, a pseudo-random combination of m transistors MP and of m transistors MN among the set of transistors which can be selected. Then, equalization, and therefore increase of the accuracy, are obtained through an averaging effect. Of course, the best results are obtained if switching is carried out at a significantly higher frequency than the sampling frequency of the digital data to be converted.

Figure 3:
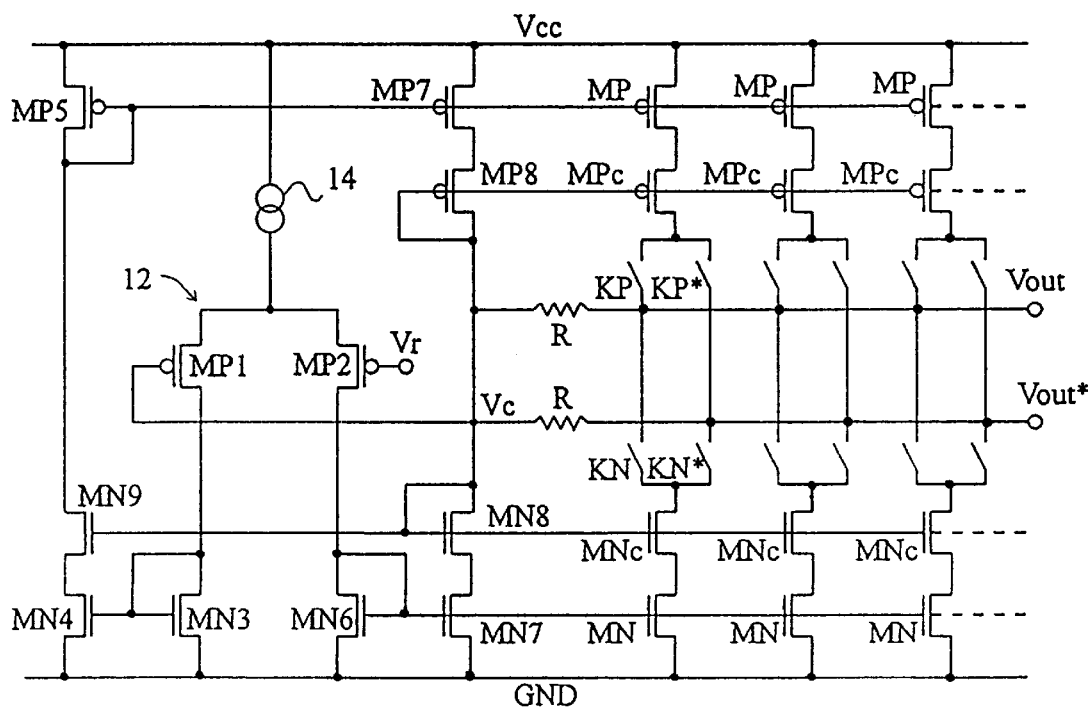
FIG. 3 is an alternative embodiment of a digital-to-analog converter according to the present invention.

FIG. 3 represents a modification of the converter of FIG. 2, to render the converter less sensitive to variations of its supply voltage. Each transistor MP is connected to its switches KP and KP* through a P-channel cascode transistor MPc. Similarly, each transistor MN is connected to its switches KN and KN* through an N-channel cascode transistor MNc. The amplifier includes an additional output stage for biasing the cascode transistors MPc and MNc. This additional stage includes a P-channel MOS transistor MP7 having its gate and its source connected in parallel with transistors MP, and an N-channel MOS transistor MN7 having its gate and its source connected in parallel with transistors MN. The drain of transistor MP7 is connected to the middle node of the bridge of resistors R through a P-channel MOS transistor MP8 having its drain and gate connected to the gates of transistors MPc. Transistor MN7 is connected to the middle node of the bridge of resistors R through an N-channel MOS transistor MN8 having its drain and gate connected to the gates of transistors MNc.

With this configuration, the drain voltage of transistors MP is fixed to voltage Vc increased by the threshold voltage of transistors MPc, and the drain voltage of transistors MN is fixed to voltage Vc decreased by the threshold voltage of transistors MNc. The peak voltage at output Vout or Vout* is thus limited to the threshold voltage of a transistor MPc or MNc, which is sufficient.

The additional output stage which includes transistors MP7 and MN7 operates under the same conditions as the output stage formed by transistors MP and MN, and, theoretically does not supply current in resistors R. However, if there is a symmetry defect at the output stage including transistors MP and MN, the additional stage absorbs the residual current through resistors R, which cooperates to compensate for dissymmetry.

An additional N-channel cascode transistor MN9 is disposed between transistors MN4 and MP5 and its gate is connected to the gates of transistors MNc. The cascode transistor MN9 enables the operation of the current mirror MN3/MN4 under the same conditions as the current mirror MN6/MN, which improves symmetry.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A digital to analog converter comprising:

a plurality of pairs of positive and negative current sources, each current source of the plurality of pairs of positive and negative current sources being connected through respective switches to two differential output lines, the respective switches being controlled as a function of a digital data, each pair of the plurality of pairs of positive and negative current sources including a pair of transistors of an output stage of a transconductance amplifier, the transconductance amplifier having an inverting input and a non-inverting input, the non-inverting input receiving a reference voltage, and the inverting input receiving a voltage at a middle node of a bridge of series-connected resistors that are connected between the two differential output lines, the output of the digital to analog converter being a voltage between the two differential output lines.

2. The digital to analog converter of claim 1, wherein the transconductance amplifier includes:

a differential stage having first and second branches, a current in the first branch of the differential stage being mirrored in first transistors of the pairs of transistors of the output stage, and a current in the second branch of the differential stage being mirrored in second transistors of the pairs of transistors of the output stage.

3. The digital to analog converter of claims 1, wherein each transistor of the pair of transistors is connected to a respective cascode transistor that is biased with respect to the voltage at the middle node of the bridge of series-connected resistors.

4. A digital to analog converter, comprising:

an input differential stage of a transconductance amplifier having an inverting input and an non-inverting input;

a first resistor coupled between the inverting input and a first differential output of the converter;

a second resistor coupled between the inverting input and a second differential output of the converter; and a plurality of pairs of current sources coupled through a plurality of controlled switches to the first and second differential outputs of the converter, each pair of current sources of the plurality of pairs of current sources including first and second current sources, each first current source being coupled to the first and second differential outputs through first and second switches, respectively, and each second current source being coupled to the first and second differential outputs through third and fourth switches, respectively.

5. The digital to analog converter of claim 4, wherein the input differential stage includes:

a quiescent current source;

a first circuit branch connected to the quiescent current source and to the inverting input; and a second circuit branch connected to the quiescent current source and to the non-inverting input.

6. The digital to analog converter of claim 5, further comprising:

a first current mirror coupled to the first circuit branch and to the first current source of each of the plurality of pairs of current sources; and a second current mirror coupled between the second circuit branch and the second current source of each of the plurality of pairs of current sources.

7. The digital to analog converter of claim 6, further comprising:

a plurality of cascode transistors, respective cascode transistors of the plurality of cascode transistors being connected between the first current source of each of the pairs of current sources and the first and second switches that couple each first current source to the first and second differential outputs, and between the second current source of each of the pairs of current sources and the third and fourth switches that couple each second current source to the first and second differential outputs, wherein each of the respective cascode transistors has a control terminal that is connected to the inverting input of the input differential stage.

8. The digital to analog converter of claim 5, wherein each pair of current sources includes a pair of transistors that form an output stage of the transconductance amplifier.

9. The digital to analog converter of claim 8, wherein the first circuit branch has a first current, the second circuit branch has a second current, and the converter further comprises:

a first current mirror coupled to the first circuit branch and to a first transistor of the pair of transistors of each pair of current sources, the first current mirror mirroring the first current in the first transistor of each pair of current sources; and a second current mirror coupled to the second circuit branch and to a second transistor of the pair of transistors of each pair of current sources, the second current mirror mirroring the second current in the second circuit branch in the second transistor of each pair of current sources.

10. The digital to analog converter of claim 9, wherein:

each first current source includes a transistor of a first polarity that is connected between a first voltage potential terminal and the first and second switches, each transistor of the first polarity having a control terminal that is connected to the first current mirror; and each second current source includes a transistor of a second polarity that is connected between a second voltage potential terminal and the third and fourth switches, each transistor of the second polarity having a control terminal that is connected to the second current mirror.

11. The digital to analog converter of claim 10, wherein:

a resistance of the first resistor is substantially identical to the resistance of the second resistor.

12. The digital to analog converter of claim 10, further comprising:

a plurality of cascode transistors including cascode transistors of the first polarity and cascode transistors of the second polarity, a respective cascode transistor of the first polarity being connected between each transistor of the first polarity and each first and second switch, and a respective cascode transistor of the second polarity being connected between each transistor of the second polarity and each third and fourth switch, wherein each of the plurality of cascode transistors has a control input that is connected to the inverting input of the input differential stage.

13. A method of producing a differential output voltage signal in a digital to analog converter having a plurality of pairs of current sources, each pair of current sources including a first current source that is switchably connected to one of a first differential output of the converter and a second differential output of the converter by a respective switch of a corresponding first pair of switches, and a second current source that is switchably connected to one of the first differential output and the second differential output by a respective switch of a corresponding second pair of switches, the first differential output being connected to the second differential output by a pair of series-connected resistors, the method comprising the steps of:

switchably connecting the first current source of at least one pair of current sources to the first differential output and switchably connecting the second current source of the at least one pair of current sources to the second differential output;

generating a first current in the first current source of the at least one pair of current sources;

generating a second current in the second current source of the at least one pair of current sources; and adjusting a conductance of the first current source of the at least one pair of current sources to center the differential output voltage signal about a reference voltage signal.

14. The method of claim 13, further comprising a step of:
adjusting a conductance of the second current source of the at least one pair of current sources to center the differential output voltage signal about the reference voltage signal.

15. The method of claim 14, further comprising a step of:
biasing the first current source and the second current source of the at least one pair of current sources to reduce variations in the differential output signal due to fluctuations in supply voltages.

16. The method of claim 14, further comprising steps of:
detecting a difference between the reference voltage and a center voltage between the pair of series-connected resistors prior to the steps of adjusting.

17. The method of claim 16, wherein the steps of adjusting conductance include steps of:
decreasing the conductance of the first current source of the at least one pair of current sources and increasing the conductance of the second current source of the at least one pair of current sources when the center voltage is higher than the reference voltage; and
increasing the conductance of the first current source of the at least one pair of current sources and decreasing the conductance of the second current source of the at least one pair of current sources when the center voltage is lower than the reference voltage.

18. The method of claim 17, further comprising a step of:
biasing the first current source and the second current source of the at least one pair of current sources to reduce variations in the differential output signal due to fluctuations in supply voltages.

19. The method of claim 14, further comprising a step of:
pseudo-randomly selecting, from among the plurality of pairs of current sources, the at least one pair of current sources to connect during the step of connecting to increase an accuracy of the differential output voltage signal by adjusting the conductance of the first and second current sources of each of the plurality of pairs of current sources over time.

20. The method of claim 14, wherein the steps of generating include a step of:
producing a first branch current and mirroring the first branch current to generate the first current in the first current source of the at least one pair of current sources; and
producing a second branch current and mirroring the second branch current to generate the second current in the second current source of the at least one pair of current sources.

21. The method of claim 20, wherein the method further comprises a step of determining a difference between the reference voltage and a center voltage between the pair of series resistors prior to the steps of adjusting, and the steps of adjusting conductance including the steps of:
decreasing a magnitude of the first branch current and increasing a magnitude of the second branch current when the center voltage is higher than the reference voltage, wherein decreasing the magnitude of the first branch current reduces the conductance of the first current source of the at least one pair of current sources, and wherein increasing the magnitude of the second branch current increases the conductance of the second current source of the at least one pair of current sources; and
increasing a magnitude of the first branch current and decreasing a magnitude of the second branch current when the center voltage is lower than the reference voltage, wherein increasing the magnitude of the first branch current increases the conductance of the first current source of the at least one pair of current sources, and wherein decreasing the magnitude of the second branch current reduces the conductance of the second current source of the at least one pair of current sources.

22. A method of producing a differential output voltage signal that is centered about a reference voltage signal, the method comprising the steps of:
generating at least one first current in a plurality of first current sources;
generating at least one second current in a plurality of second current sources;
switchably connecting a first of the plurality of first current sources to one of a first differential output line and a second differential output line, the first differential output line being connected to the second differential output line by a pair of series resistors;
switchably connecting a first of the plurality of second current sources to one of the first differential output line and the second differential output line; and
adjusting a conductance of the first and second current sources to center the differential output voltage signal produced between the first and the second differential output lines about the reference voltage signal.

23. The method of claim 22, wherein the first of the plurality of second current sources is switchably connected to the second differential output line when the first of the plurality of first current sources is switchably connected to the first differential output line, and the first of the plurality of second current sources is switchably connected to the first differential output line when the first of the plurality of first current sources is switchably connected to the second differential output line.

24. The method of claim 22, further comprising a step of biasing each of the plurality of first current sources and each of the plurality of second current sources to reduce variations in the differential output voltage signal due to fluctuations in supply voltages.

25. The method of claim 22, further comprising a step of detecting a difference between the reference voltage signal and a center voltage signal between the pair of series resistors.

26. The method of claim 25, wherein the step of adjusting includes steps of:
decreasing the conductance of the first current source and increasing the conductance of the second current source when the center voltage is higher than the reference voltage, the first current source is switchably connected to the first differential output line, and the second current source is switchably connected to the second differential output line; and
increasing the conductance of the first current source and decreasing the conductance of the second current source when the center voltage is lower than the reference voltage, the first current source is switchably connected to the first differential output line, and the second current source is switchably connected to the second differential output line.

27. The method of claim 22, further comprising the steps of:
determining a quantity of the plurality of first and second current sources to switchably connect to one of the first and second differential output lines;
selecting individual current sources from the plurality of first and second current sources to form the quantity; and selecting one of the first and second differential output lines, for each first and second current source of the quantity, to produce a desired differential output voltage signal.

28. The method of claim 27, wherein the step of selecting individual current sources includes a step of selecting a pseudo random combination of individual current sources from the plurality of first and second current sources.

29. A digital to analog converter producing a differential output voltage signal centered about a reference voltage signal comprising:

a plurality of pairs of positive and negative current sources, each positive current source of the pairs of positive and negative current sources being connected through a respective first switch to a first differential output line and being connected through a respective second switch to a second differential output line, each negative current source of the pairs of positive and negative current sources being connected through a respective third switch to the first differential output line and being connected through a respective fourth switch to the second differential output line;

a pair of series resistors connected between the first differential output line and the second differential output line;

means, coupled to each of the respective first, second, third, and fourth switches, for closing at least one of the respective first and second switches, and at least one of the respective third and fourth switches, to connect at least one pair of positive and negative current sources to the first and second differential output lines; and means, coupled to each of the plurality of pairs of positive and negative current sources, for receiving the reference voltage signal and adjusting a conductance of the at least one pair of current sources to center the differential output voltage signal produced between the first and second differential output lines about the reference voltage.

30. The digital to analog converter of claim 29, wherein the means for closing connects the positive current source and the negative current source of the at least one pair of positive and negative current sources to a different one of the first and second differential output lines, respectively.

31. The digital to analog converter of claim 29 further comprising:

first means, coupled between the each positive current source and the respective first and second switch of a respective pair of positive and negative current sources, for reducing variations in the differential output voltage signal due to fluctuations in a first supply voltage.

32. The digital to analog converter of claim 31 further comprising:

second means, coupled between the each negative current source and the respective third and fourth switch of a respective pair of positive and negative current sources, for reducing variations in the differential output voltage signal due to fluctuations in a second supply voltage.

33. The digital to analog converter of claim 29, wherein the means for receiving and adjusting is connected to a center voltage between the pair of series resistors, the means for receiving and adjusting including:

means for detecting a difference between the reference voltage signal and the center voltage;

first means for varying the conductance of the positive current source of the at least one pair of current sources, the first means decreasing the conductance of the positive current source of the at least one pair of current sources when the center voltage is higher than the reference voltage, the positive current source is connected to the first differential output line, and the negative current source is connected to the second differential output line, and the first means increasing the conductance of the positive current source of the at least one pair of current sources when the center voltage is lower than the reference voltage, the positive current source is connected to the first differential output line, and the negative current source is connected to the second differential output line; and second means for varying the conductance of the negative current source of the at least one pair of current sources, the second means increasing the conductance of the negative current source of the at least one pair of current sources when the center voltage is higher than the reference voltage, the positive current source is connected to the first differential output line, and the negative current source is connected to the second differential output line, the second means decreasing the conductance of the negative current source of the at least one pair of current sources when the center voltage is lower than the reference voltage, the positive current source is connected to the first differential output line, and the negative current source is connected to the second differential output line.

34. The digital to analog converter of claim 33, wherein the means for detecting the difference includes an input stage of a differential amplifier having a non-inverting input connected to the reference voltage signal and having an inverting input connected to the center voltage.

35. The digital to analog converter of claim 33, wherein the first means includes a first current mirror connected to the input stage of the differential amplifier and to each positive current source of the plurality of pairs of positive and negative current sources.

* * * * *